(12) United States Patent
Sumant et al.

(10) Patent No.: US 9,890,345 B2
(45) Date of Patent: *Feb. 13, 2018

(54) SUPERLUBRICATING GRAPHENE AND GRAPHENE OXIDE FILMS

(71) Applicant: UChicago Argonne, LLC, Chicago, IL (US)

(72) Inventors: Anirudha V. Sumant, Plainfield, IL (US); Ali Erdemir, Naperville, IL (US); Junho Choi, Chicago, IL (US); Diana Berman, Darien, IL (US)

(73) Assignee: UChicago Argonne, LLC, Chicago, IL (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/415,499

(22) PCT Filed: Jul. 18, 2013

(86) PCT No.: PCT/US2013/051121
§ 371 (c)(1),
(2) Date: Jan. 16, 2015

(87) PCT Pub. No.: WO2014/015165
PCT Pub. Date: Jan. 23, 2014

(65) Prior Publication Data
US 2015/0197701 A1   Jul. 16, 2015

Related U.S. Application Data

(63) Continuation of application No. 13/553,484, filed on Jul. 19, 2012.

(51) Int. Cl.
*F16C 33/04* (2006.01)
*C10M 103/04* (2006.01)
(Continued)

(52) U.S. Cl.
CPC ............. *C10M 103/04* (2013.01); *B05D 1/02* (2013.01); *B05D 5/08* (2013.01); *C10M 103/02* (2013.01);
(Continued)

(58) Field of Classification Search
CPC .......... B05D 1/02; B05D 5/08; C10M 103/02; C10M 103/04; C10M 177/00;
(Continued)

(56) References Cited

U.S. PATENT DOCUMENTS 5,462,362 A * 10/1995 Yuhta .................. A61F 2/30771
384/13
5,922,418 A * 7/1999 Koike .................. C23C 16/045
427/122
(Continued)

FOREIGN PATENT DOCUMENTS

CN        102627993 A  *  8/2012
RU           231077 C2    11/2007
(Continued)

OTHER PUBLICATIONS

RU 2310777 C2 Machine Translation.*
(Continued)

*Primary Examiner* — Maria Veronica Ewald
*Assistant Examiner* — Travis Figg
(74) *Attorney, Agent, or Firm* — Foley & Lardner LLP

(57) ABSTRACT

A system and method for forming at least one of graphene and graphene oxide on a substrate and an opposed wear member. The system includes graphene and graphene oxide formed by an exfoliation process or solution processing method to dispose graphene and/or graphene oxide onto a substrate. The system further includes an opposing wear (Continued)

member disposed on another substrate and a gas atmosphere of an inert gas like N2, ambient, a humid atmosphere and a water solution.

8 Claims, 16 Drawing Sheets

(51) Int. Cl.
    *C10M 177/00*     (2006.01)
    *C10M 103/02*     (2006.01)
    *B05D 1/02*     (2006.01)
    *B05D 5/08*     (2006.01)
    *C23C 16/26*     (2006.01)
    *C23C 16/40*     (2006.01)
    *B82Y 30/00*     (2011.01)

(52) U.S. Cl.
    CPC .......... *C10M 177/00* (2013.01); *C23C 16/26* (2013.01); *C23C 16/40* (2013.01); *B82Y 30/00* (2013.01); *C10M 2201/0413* (2013.01); *C10N 2230/06* (2013.01); *C10N 2250/08* (2013.01); *C10N 2250/121* (2013.01); *C10N 2270/00* (2013.01); *C10N 2280/00* (2013.01); *Y10T 428/30* (2015.01)

(58) Field of Classification Search
    CPC ............ C10M 2201/0413; C23C 16/26; C23C 16/40; B82Y 30/00; C10N 2230/06; C10N 2250/08; C10N 2250/121; C10N 2270/00; C10N 2280/00; Y10T 428/30
    See application file for complete search history.

(56) References Cited

U.S. PATENT DOCUMENTS

| | | | |
|---|---|---|---|
| 2007/0158609 A1* | 7/2007 | Hong | B82Y 30/00 252/71 |
| 2008/0116011 A1* | 5/2008 | Takahama | B21B 27/10 184/6.26 |
| 2008/0302998 A1* | 12/2008 | Hong | C09K 5/10 252/74 |
| 2009/0033164 A1* | 2/2009 | Khan | C10M 169/04 310/90 |
| 2010/0087346 A1 | 4/2010 | Giesler et al. | |
| 2011/0046027 A1* | 2/2011 | Zhamu | C10M 103/02 508/113 |
| 2012/0115761 A1* | 5/2012 | Basu | C10M 133/16 508/156 |
| 2013/0324447 A1* | 12/2013 | Tsou | C10M 161/00 508/131 |
| 2015/0197701 A1* | 7/2015 | Sumant | B05D 1/02 508/108 |

FOREIGN PATENT DOCUMENTS

| | | | | |
|---|---|---|---|---|
| RU | 2310777 C2 * | 11/2007 | | |
| WO | WO 2010125059 A1 * | 11/2010 | .......... | C09D 161/06 |
| WO | WO2011/081538 | 7/2011 | | |
| WO | WO 2011081538 A1 * | 7/2011 | .......... | C10M 103/06 |

OTHER PUBLICATIONS

Kim et al. ("Chemical Vapor Deposition—Grown Graphene: The Thinnest Solid Lubricant" ACS Nano 2011, 5, p. 5107-5114).*
US Office Action for U.S. Appl. No. 13/553,484, dated Nov. 4, 2015, 13 pages.
Stankovich, S., et al., "Synthesis of graphene-based nanosheets via chemical reduction of exfoliated graphite oxide"., Carbon 45 (2007), pp. 1558-1565.
Notification of Transmittal of the International Search Report and the Written Opinion of the International Searching Authority, or the Declaration, International Search Report and Written Opinion of the International Searching Authority for PCT/US2013/051121, dated Nov. 14, 2013, 8 pages.
Singhbabu, et al., Efficient anti-corrosive coating of cold-rolled steel in a seawater environment using an oil-based graphene oxide ink, Nanoscale, 2015, 7, 8035, 13 pages.
Office Action for U.S. Appl. No. 13/553,484, dated Jul. 13, 2016, 40 pages.
Office Action in U.S. Appl. No. 13/553,484, dated Feb. 16, 2017, 24 pages.
Final Office Action in U.S. Appl. No. 13/553,484, dated Sep. 27, 2017, 23 pages.

* cited by examiner

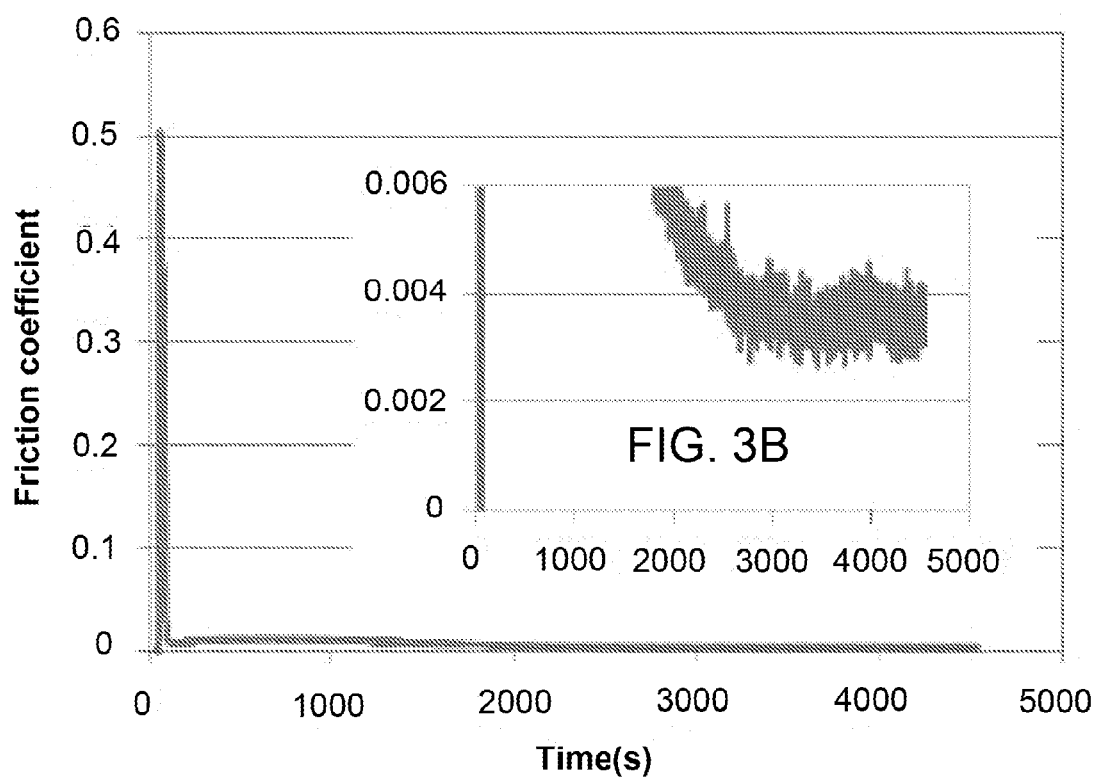

FIG. 4A
FIG. 4B
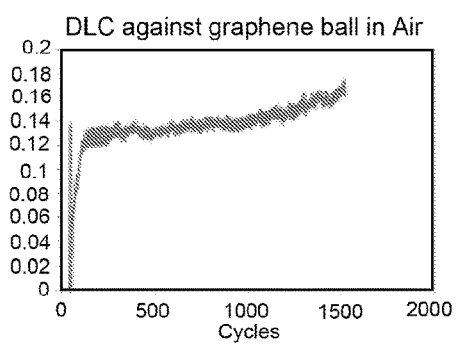
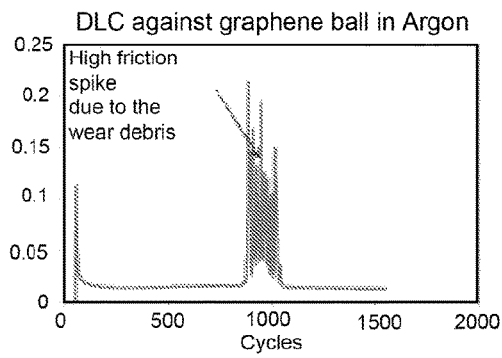
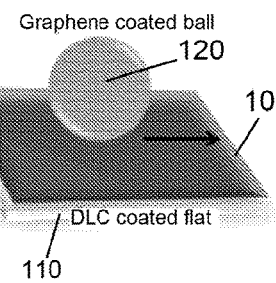
High wear debris on graphene coated ball running against DLC flat
Less wear debris on graphene coated ball running against DLC flat
FIG. 4C
FIG. 4D
FIG. 4E

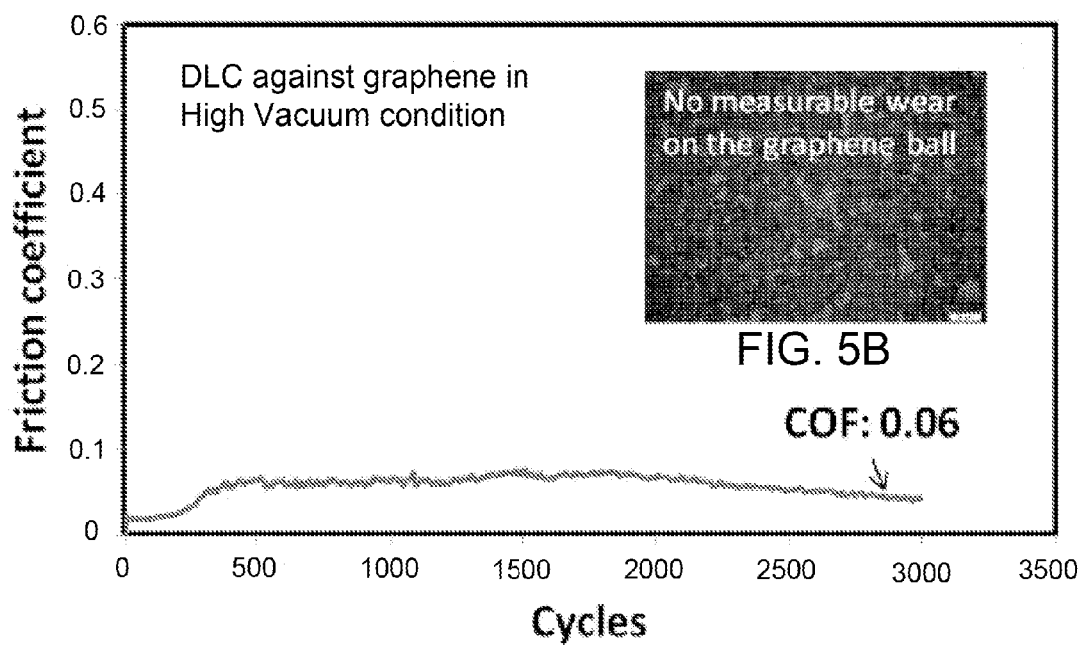

Minimal wear on the DLC ball

No measurable wear on the stainless steel surface

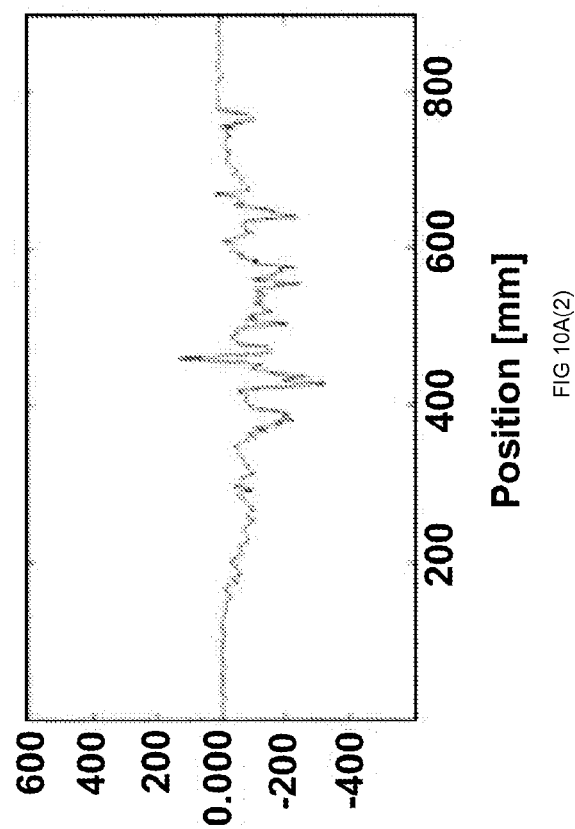
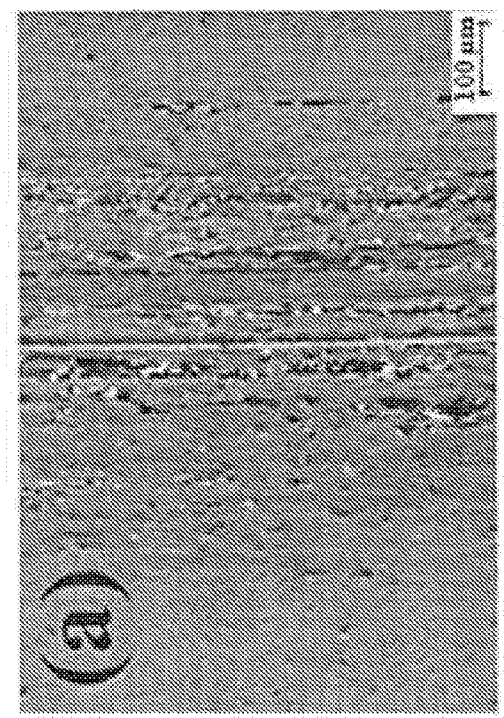
FIG 10A(1)
FIG 10A(2)
FIG. 10A

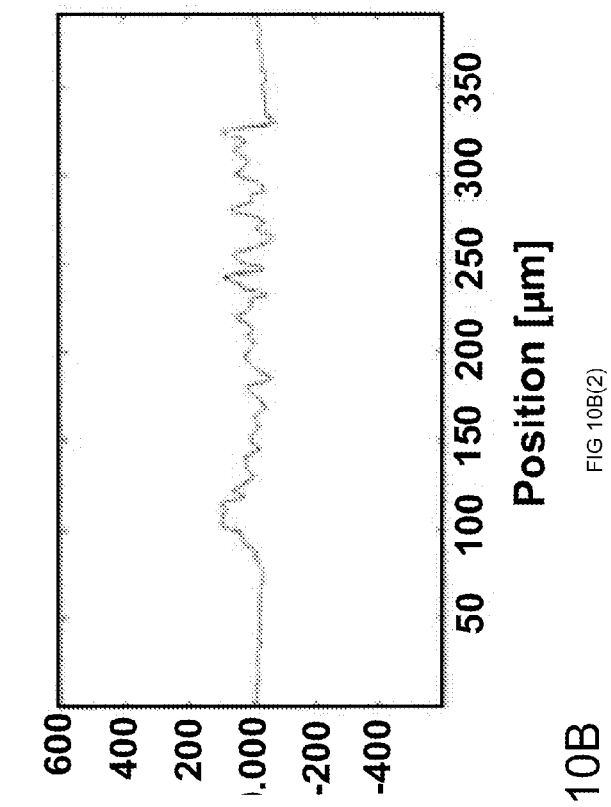
FIG. 10B(2)
FIG. 10B
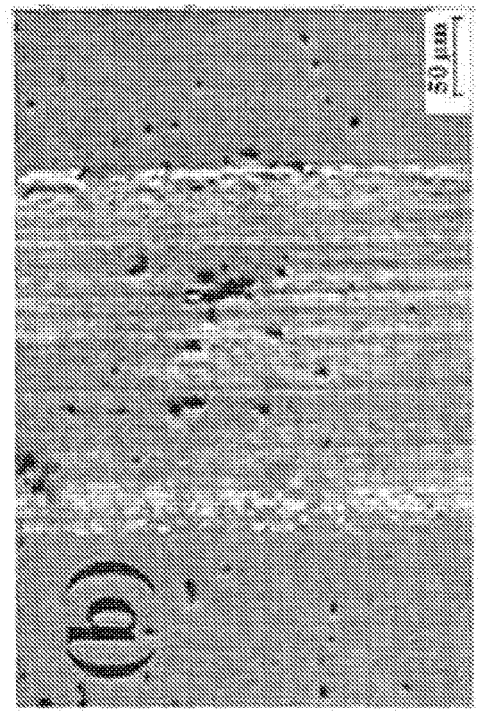
FIG 10B(1)

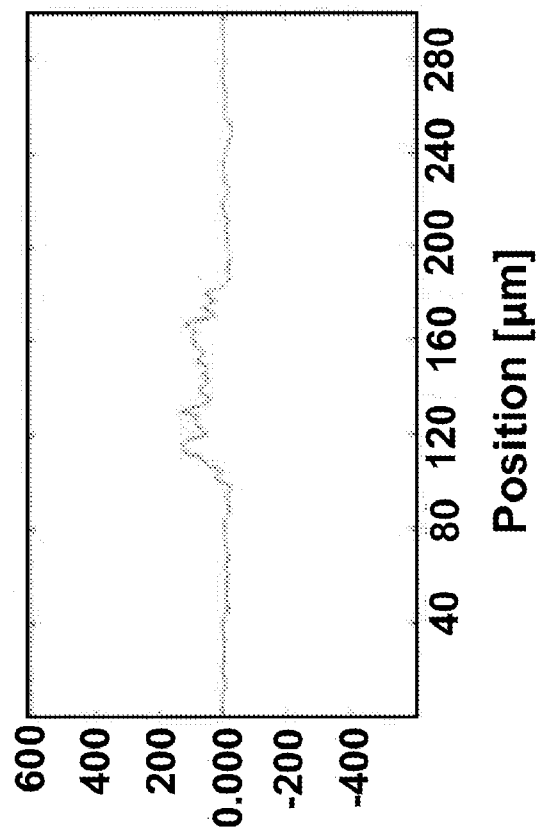
FIG 10C(2)
FIG. 10C
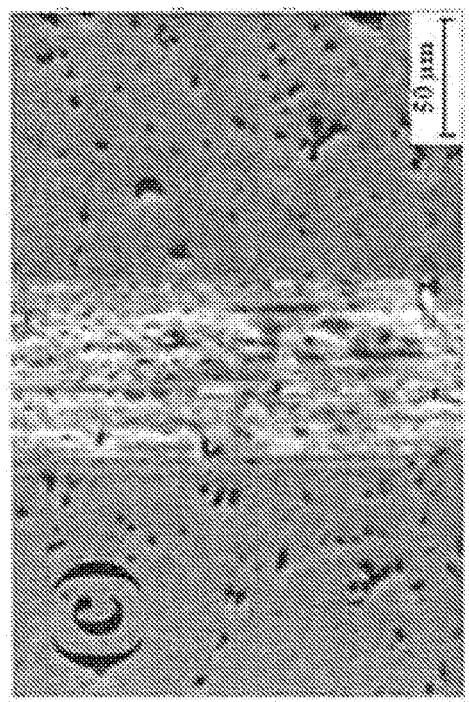
FIG 10C(1)

SPG

SPGO

XPS

Raman

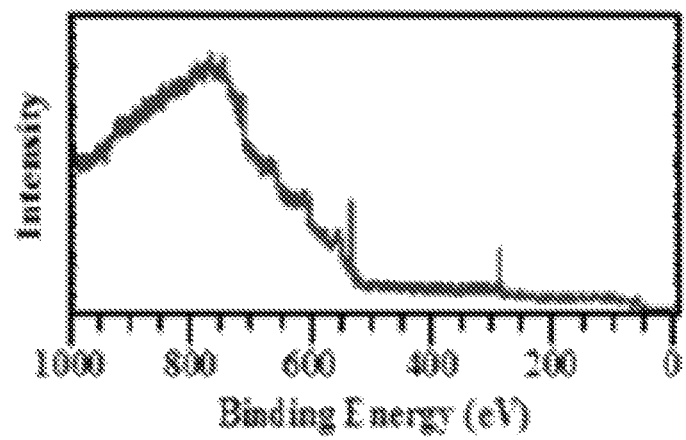
FIG 11A(2)
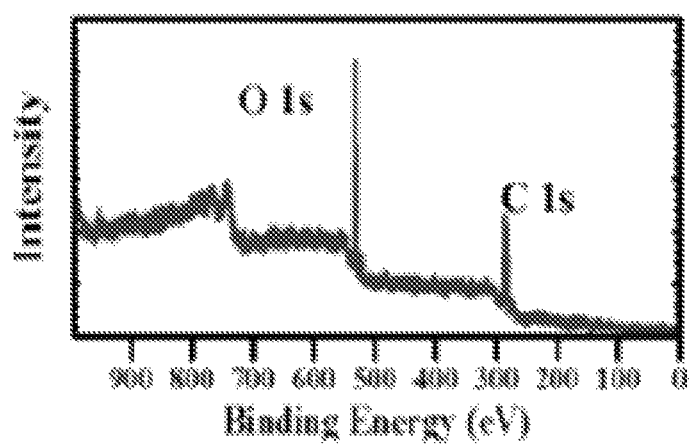
FIG 11(B)2

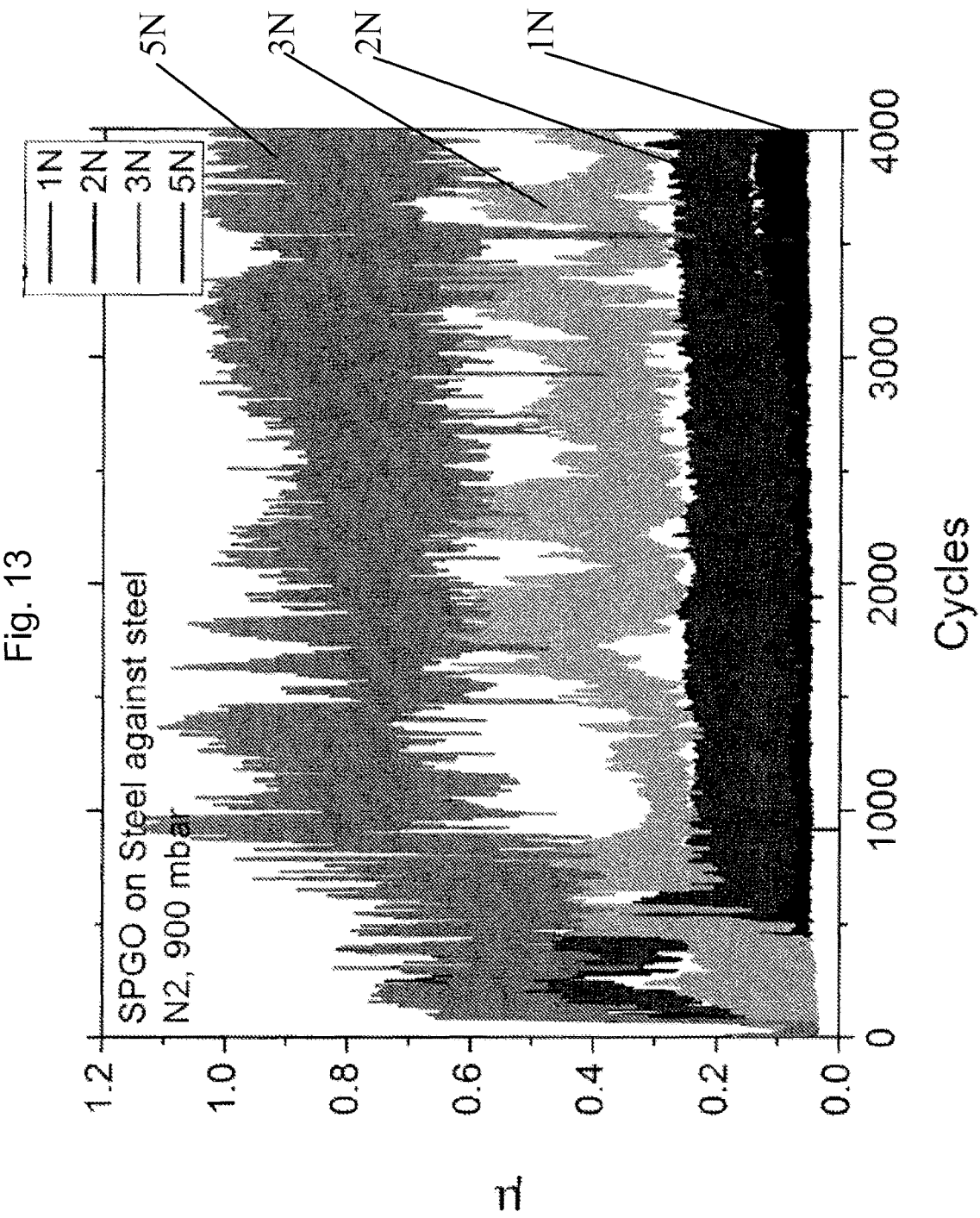

SUPERLUBRICATING GRAPHENE AND GRAPHENE OXIDE FILMS

STATEMENT OF GOVERNMENT INTEREST

The United States Government claims certain rights in this invention pursuant to Contract No. W-31-109-ENG-38 between the United States Government and the University of Chicago and/or pursuant to DE-AC02-06CH11357 between the United States Government and UChicago Argonne, LLC representing Argonne National Laboratory.

CROSS REFERENCE TO RELATED APPLICATIONS

This application is a PCT National Phase application of PCT/US2013/051121, filed Jul. 18, 2013, which claims priority to U.S. application Ser. No. 13/553,484, filed Jul. 19, 2012, both applications are incorporated by reference herein in their entirety.

FIELD OF THE INVENTION

The invention is directed generally to a method and system for producing a graphene and graphene oxide films, such as for example, a superlubricating, low wear graphene and/or graphene oxide film article of manufacture. More particularly the invention is directed to a method and system for producing a multi-layer graphene and/or graphene oxide film, preferably using either a CVD process a chemical exfoliation/mechanical exfoliation process or solution processing methodology. When the film is deposited on a substrate, such as metals or oxides, the film exhibits superlubricity under selected friction conditions, such as in dry nitrogen/argon and sliding against hydrogenated DLC coatings or solid material layers and in the case of graphene oxide in humid or even water based solutions. The invention also is directed to a low wear and low friction article for a metal against metal configuration using exfoliated graphene and/or graphene oxide at the interface without using any liquid lubricants (except water with graphene oxide).

BACKGROUND OF THE INVENTION

In 2004 an important discovery was published by Geim and Novoselov regarding the exceptional electronic properties of graphene in a suspended form. Subsequently, many researchers have studied graphene material properties and determined graphene has other interacting thermal, chemical, optical and mechanical properties. However, very little research has been done on exploring tribological properties of graphene or graphene oxide. Graphene or graphene oxide are considered as good candidates as self-lubricating materials, due to their chemically inert nature, strong mechanical properties and low shear strength on its densely packed and atomically smooth surfaces. Since it is ultrathin, even with multi-layers, it can be transferred onto MEMS/NEMS devices for operation and use at the oscillating, rotating and sliding contacts to reduce stiction, friction and wear.

The term superlubricity is defined as a regime of motion in which friction vanishes or almost vanishes. However, it is never zero; therefore, it should not be confused with other similar terms such as superconductivity or superfluidity. Superlubricity may occur when two crystalline surfaces slide over each other in dry incommensurate contact. This effect, also called structural lubricity, was suggested in 1991 and verified with great accuracy between two single crystal graphite surfaces in 2004. Similar effect of ultra-low friction has also been observed between the interwalls of two nested multiwalled carbon nanotubes. Atoms in graphite are oriented in a hexagonal manner and form an atomic hill-and-valley landscape, which looks like an egg-crate. When the two graphite surfaces are in registry (every 60 degrees), the friction force is high. When the two surfaces are rotated out of registry, the friction is greatly reduced. This is like two egg-crates which can slide over each other more easily when they are "twisted" with respect to each other. Since this effect is due to the incommensurability of lattice planes sliding against each other, the effect is restricted to material interactions at the nanoscale. At macro-scale, this effect diminishes due to the loss of structural order and presence of many defects. It is therefore understood why superlubricity is very difficult to achieve at macro-scale levels.

SUMMARY OF THE INVENTION

In a preferred embodiment of the invention a wear system and method of manufacture includes establishing a passivating or friction reducing graphene or graphene oxide layer on a substrate (for metals such as all forms of steel and Ni and for insulators such as $SiO_2$, carbides and nitrides), providing an opposed component in contact as part of a mechanical component. The opposed component comprises, for example, a diamond-like carbon ("DLC") layer or other materials as described hereinafter, with the region of the mechanical component wherein the contact occurs having a dry $N_2$ atmosphere or in the case of graphene oxide, not only in $N_2$ but in a water based solution or humid air. In one most preferred form of the invention involving graphene, the DLC layer is a hydrogenated diamond-like carbon. The achievement of such superlubricity in graphene and graphene oxide at the macro-scale at room temperature is technically and commercially very important.

In yet another embodiment superlow friction and wear is achieved with solution processed graphene ("SPG" hereinafter) or solution processed graphene oxide ("SPGO" hereinafter) obtained using a conventional chemical/mechanical or any other exfoliation process when sprayed on any given surface in dry nitrogen or in the case of SPGO, also can be processed in ambient or humid air as well as dry nitrogen. The process for producing graphene or graphene oxide flakes could be any conventional process, including simple mechanical exfoliation. A number of substrate materials can be used, including steels, such as stainless steel, transition metals like Cu and Ni, and insulators, like $SiO_2$; and each resulting material displayed superlow friction along with substantial reduction in wear. The fact that graphene and graphene oxide layers can be transferred (sprayed) or deposited otherwise on any given solid surface such as stainless steel, $SiO_2$, carbides and nitrides, at atmospheric pressures and temperatures and can achieve superlow friction means this technology will have substantial commercial applications, such as, for example, in the automotive industry as well as in microelectromechanical (MEMS) industry, where energy dissipation due to the friction is a major problem or for SPGO in any environment having water present. There is no known other graphene or graphene oxide-based technology that can provide such a low friction employing an uncomplicated method of manufacture and can be used under conditions that are most suited for many commercial applications.

In a further embodiment, low friction and wear is achieved in an article including steel against steel or any desired substrate with the use of SPG or SPGO at the interface in dry nitrogen or other inert gas environment or for SPGO not only in $N_2$ or inert gas, but also for water containing environments without the use of any oil based lubricants. These and other advantages and features of the invention, together with the organization and manner of operation thereof, will become apparent from the following detailed description when taken in conjunction with the accompanying drawings.

In an additional embodiment the hereinafter described graphene and graphene oxide can be deposited on a substrate using an electro-deposition method, thereby co-depositing the graphene or graphene oxide along with a metal on the surface of the substrate.

BRIEF DESCRIPTION OF THE DRAWINGS

FIG. 3A illustrates a plot of a pin-on-disc friction coefficient measurements performed on a graphene film grown on a Ni thin film sample and FIG. 3B inset shows a magnified view of a portion of FIG. 3A where the lowest coefficient of friction (COF) has a value of 0.003;

FIG. 4A illustrates a pin on disc friction coefficient test carried out with a graphene coated ball (see FIG. 4D) in air; FIG. 4B illustrates a test in Argon; FIG. 4C illustrates high wear debris on a graphene coated ball running against a DLC flat; FIG. 4D shows a graphene coated ball on a DLC flat and FIG. 4E shows less wear debris on a graphene coated ball running against a DLC flat;

FIG. 5A shows a pin on disk friction coefficient list performed on a graphene coated ball against a DLC flat in a high vacuum with low friction and no measureable wear (see FIG. 5B micrograph of graphene ball surface);

FIG. 9B shows results for dry nitrogen without SPG and with SPG;

FIGS. 10A(1) and 10A(2) show height profile measurements of the wear tracks for steel against steel; FIGS. 10B(1) AND 10B(2) show for steel against SPG/steel in liquid SPG; and FIGS. 10C(1) and 10C(2) show steel against SPG/steel with adding SPG every 400 cycles;

FIG. 13 shows coefficient of friction versus cycles for SPGO on steel versus steel in dry $N_2$ at 900 mbar pressure for four different loading values (1N, 2N, 3N and 5N).

DETAILED DESCRIPTION OF PREFERRED EMBODIMENTS

Figure 1:
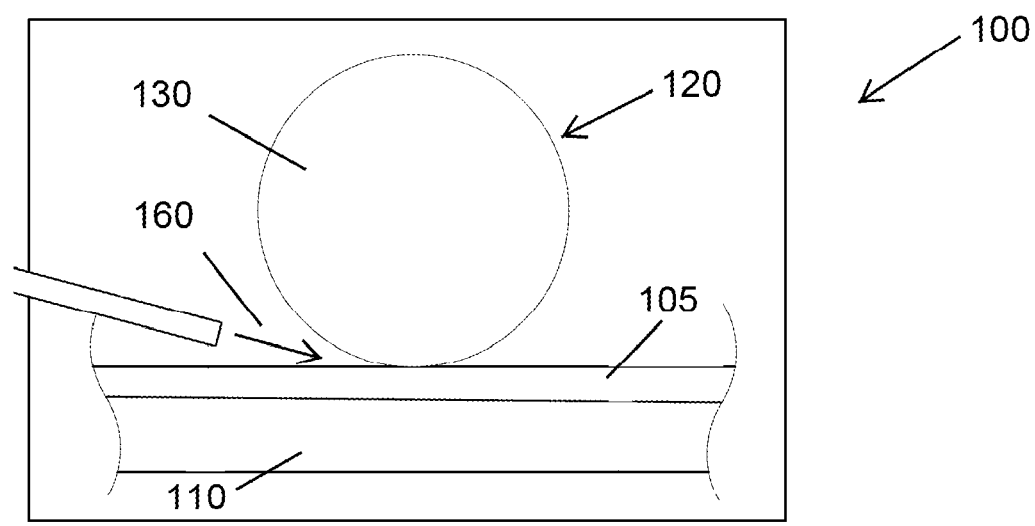
FIG. 1 illustrates an article of manufacture of a system of low friction mechanical components.

In the following description graphene embodiments are initially described and in a later section graphene oxide embodiments are described. In a preferred form of the invention a mechanical system 100 is shown in FIG. 1. A multi-layer graphene film 105 is deposited on a Ni substrate 110 and is disposed to be in moving contact with a DLC coating 120 on coated component 130 such as a ball. In other forms of the invention the opposing surface can be any selected material, such as metals or insulators, for a given user application. Diamond-like carbon (DLC) exists in several forms of amorphous carbon materials that display some of the typical properties of diamond. They are usually applied as coatings to other materials that could benefit from some of those properties. All seven types of DLC contain significant amounts of $sp^3$ hybridized carbon atoms. The reason that there are different types is that even diamond can be found in two crystalline polytypes. The usual one has its carbon atoms arranged in a cubic lattice, while the very rare one (lonsdaleite) has a hexagonal lattice. The DLC coatings are preferably amorphous, flexible, and the amount of $sp^3$ content can vary based on the hydrogen content. Typically, the hardest, and strongest, is such a mixture, known as tetrahedral amorphous carbon, or ta-C. For example, a coating of only 2 μm thickness of ta-C increases the resistance of common (i.e. type 304) stainless steel against abrasive wear; changing its lifetime in such service from one week to 85 years. Such ta-C can be considered to be the "pure" form of DLC, since it consists of mostly (~80%) $sp^3$ bonded carbon atoms. Fillers such as hydrogen, silicon, fluorine, graphitic $sp^2$ carbon, and metals are used in the other six forms to impart other desirable properties. The various forms of DLC can be applied to almost any material that is compatible with a vacuum environment.

In regard to the use of a Ni substrate in one preferred embodiment, it is one of a Ni foil or a Ni coating on a substrate; and the DLC coating 120 is a hydrogenated DLC layer. Further, the mechanical system 100 includes a dry $N_2$ gas environment 140, wherein the system 100 is within a housing 150; or a gas source 160 can provide a flowing stream 160 to establish the dry $N_2$ gas environment 140.

Figure 2A:
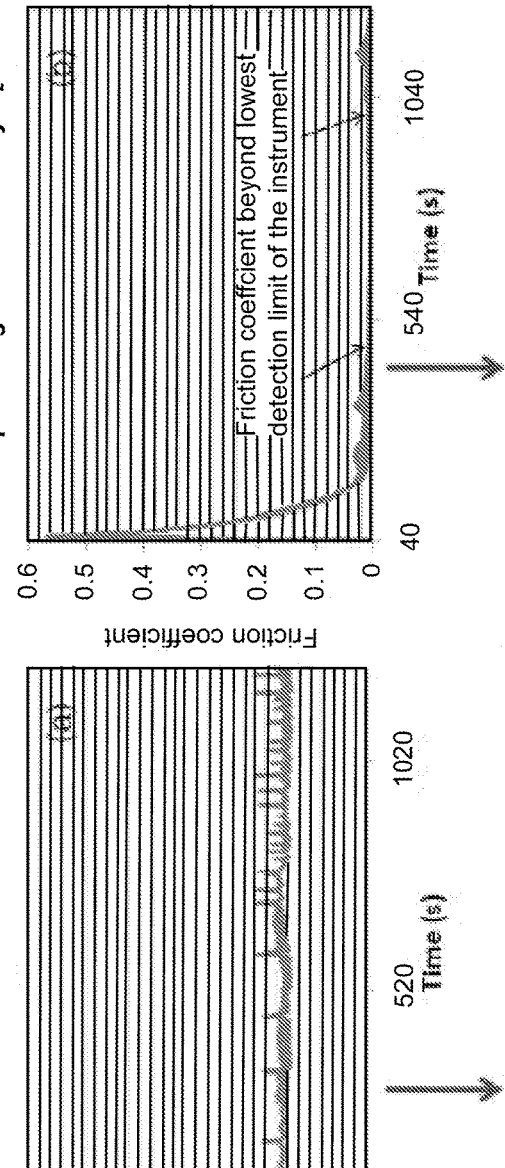
FIG. 2A illustrates coefficient of friction versus time for a multi-layer graphene film grown on a Ni foil substrate and rubbing against DLC film in air.
Figure 2B:
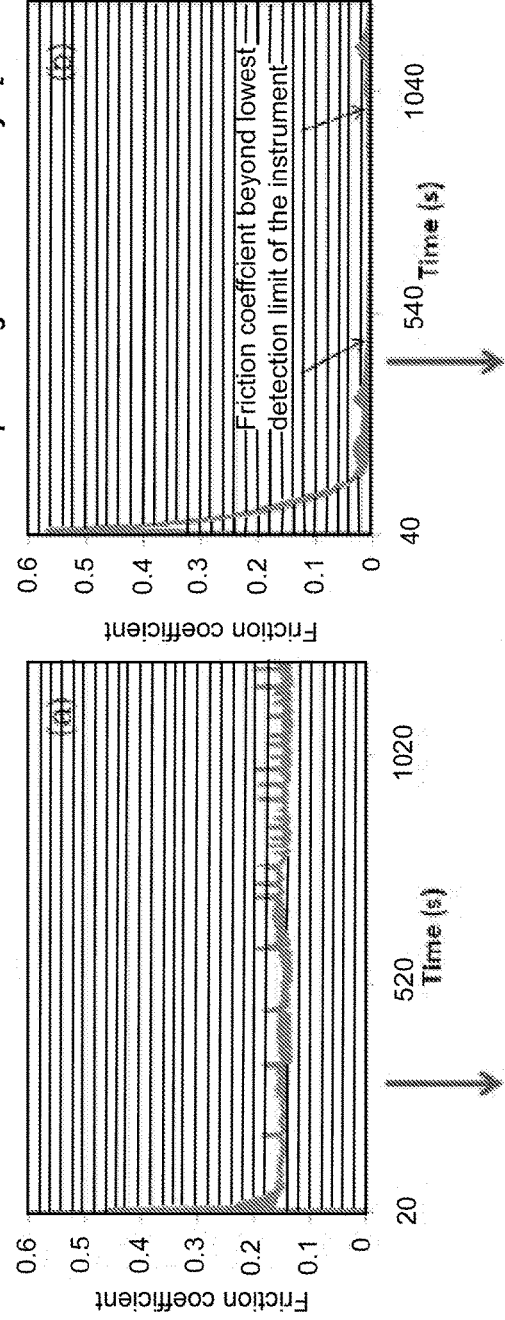
FIG. 2B illustrates the same variables as in FIG. 2A but for an atmosphere of dry $N_2$.

As shown in FIG. 1A if the gas environment 140 includes air, there is loss of superlubricity. FIG. 2B illustrates the first direct evidence that has achieved superlubricity. This occurs via a graphene film rubbing against a DLC film in a dry nitrogen or in an argon atmosphere since the friction coefficient drops below the detection limit of the instrument during the pin-on-disc friction test. Small bumps in friction coefficient at a few places during the friction test indicate that there is loss of superlubricity momentarily (perhaps due to the presence of asperities), but superlubricity is re-established, thus giving rise to a consistent near-zero coefficient of friction ("COF" hereinafter) during the remainder of the test. This system 100 illustrates an important effect where mechanical energy dissipation due to sliding motion diminishes to a near zero value, giving rise to a superlubric behavior in graphene. These results have been reproduced on multiple samples including graphene grown on bulk Ni substrates and Ni thin films which confirm it is indeed a real effect. It is important to note that superlubricity is achieved only in the inert gas environment 140 containing either dry nitrogen or argon when sliding against the DLC coating 120 indicating a strong influence of counterface materials chemical composition and surface chemistry at the tribological interface. Rubbing the DLC coating 120 against a pristine Ni surface under the same conditions produces a high frictional force, confirming the role of multilayer graphene in achieving superlubricity.

Figure 2C:
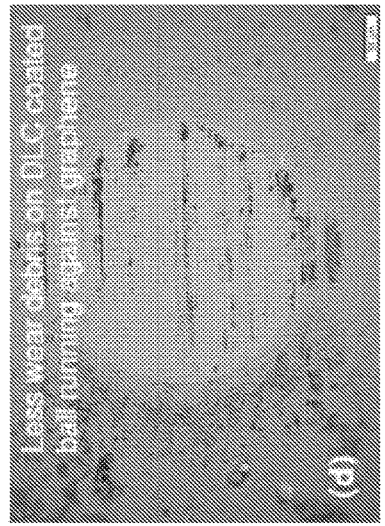
FIG. 2C shows an optical microscope image of the wear debris and an appearance of wear on a DLC coated ball running against the graphene film for FIG. 2A conditions.
Figure 2D:
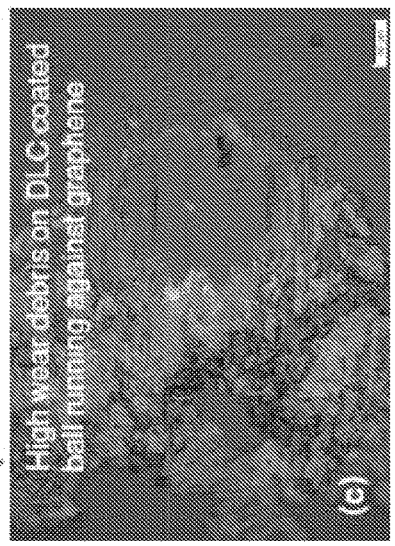
FIG. 2D shows an optical microscope image of wear debris for the conditions of FIG. 2B.

A series of friction tests were performed using a pin-on-disc type tribometer on graphene films grown on Ni foil and Ni thin film samples. The typical conditions used for the friction tests were (Load: 1-2 N, sliding velocity: 0.6 em/sec, sliding distance: 27, testing environment: air, high vacuum, dry $N_2$ and/or argon gas). Remarkable differences in friction and wear performance of graphene films were observed in air vs. in a dry nitrogen/argon environment. It is also important to note that high amount of wear debris were observed in case of DLC coated ball running against a graphene film in air due to high friction (see FIG. 2C) and very few wear debris were observed on a DLC coated ball running against graphene in dry N2(see FIG. 2D). The same result was reproduced on at least 15 Ni samples confirming reproducibility of the observed result. FIGS. 3 and 3B show friction measurements carried out on graphene films grown on Ni thin film samples showing similar COF (about 0.003) values characteristic of superlubricity as observed in case of graphene films grown on bulk Ni samples (again in a dry $N_2$ atmosphere).

Near zero friction was observed between sliding graphene film against diamond-like carbon film in a dry nitrogen atmosphere. Beyond an initial run-in period which last for a few tens of seconds, which has its own significance in many applications, the coefficient of friction (COF) comes down to some un-measurable levels (below about 0.003 which is characteristic of superlubricity) and remains there for a very long period of time, despite the fact that graphene film is only a few nanometer thick. Superlubricity is achieved at macro scales, regardless of the incommensurability and under more industrially relevant sliding conditions; and hence this discovery is industrially significant. The commercial importance of this discovery also lies in the facts that graphene layers could be transferred (sprayed) on any given solid surface (once they are synthesized) at atmospheric pressures and temperatures and can be easily scalable to large area. Currently, there is no other graphene-based technology that can provide such a low friction under conditions that are most suited for many commercial applications.

Figure 7:
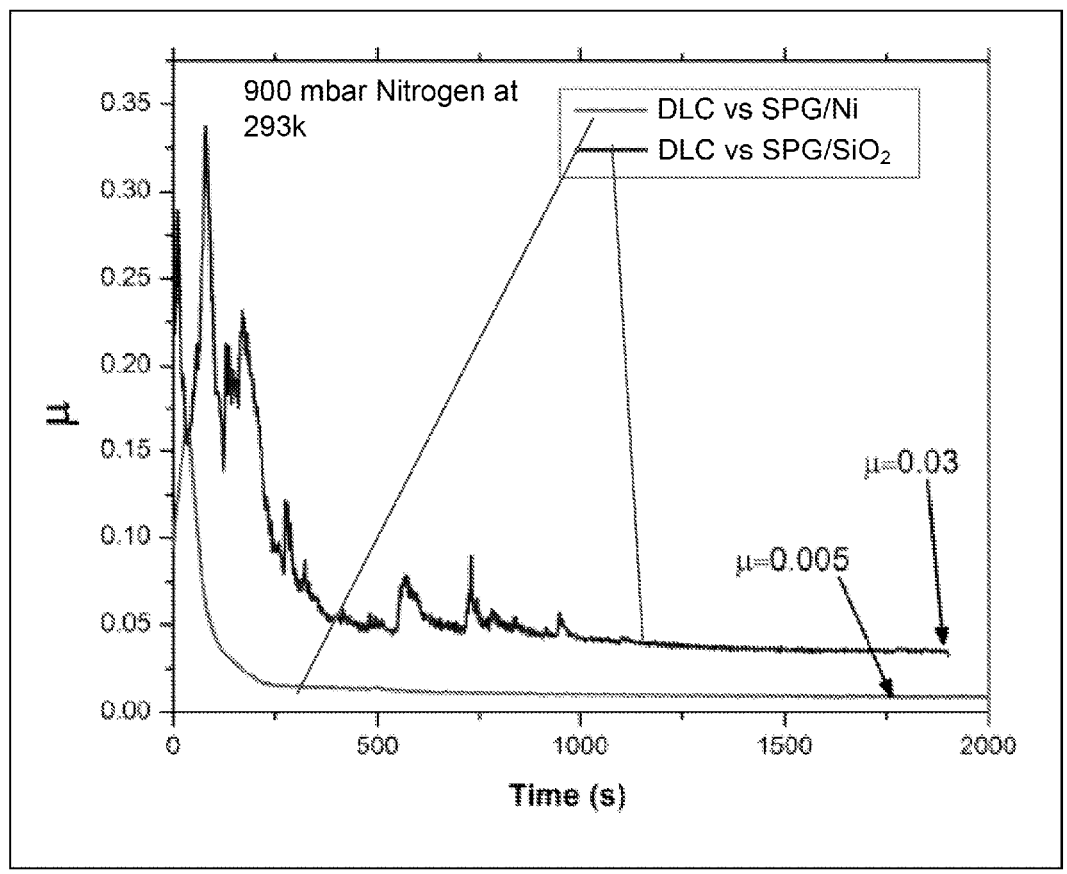
FIG. 7 shows superlubric behavior of Ni and $SiO_2$ surfaces after coating with a solution containing graphene.

In a further embodiment, lubrication potential was determined for a solution processed graphene ("SPG" hereinafter), obtained by chemical exfoliation of highly oriented pyrolytic graphite ("HOPG" hereinafter) and the resulting graphene disposed in a compatible liquid, such as water, an alcohol or hydrocarbon based solvent, to form the solution. Tribological studies were performed on various types of substrates coated with SPG graphene and in contact with the DLC coated balls 130. A trend demonstrated superlubric behavior under substantially the same test conditions as were done for other graphene types of coatings in contact the DLC coated balls 130 described herein. FIG. 7 shows results of two of such tests taken on SPG coated Ni and $SiO_2$ coated Ni surfaces against the DLC coating 120 showing COFs of 0.03 and 0.005, respectively.

The analysis of the wear rate on the graphene film 105 coated Ni substrate 110 shows that wear rate was reduced by more than 2 orders of magnitude than that of an uncoated Ni surface running against the DLC ball 130 in dry $N_2$ environment, indicating significant improvement in wear resistance of the graphene 105 on the Ni substrate 110 with the presence of the SPG type of the graphene layer 105, which is just a few nm thick. One can thus achieve superlow friction coefficient just by sprinkling of the graphene layers 105 on a given surface. This embodiment also removes one major technological hurdle for commercial uses where the substrate 110 does not have to be heated to high temperatures, such as 950° C., in order to grow the graphene layers 105. Instead, one can just sprinkle the surface with the SPG type of the graphene 105 to achieve a desired superlow COF.

Achieving low friction on $SiO_2$ (and other insulators, such as carbides and nitrides) means that the same method could be used in present micromechanical system (MEMS) to drastically reduce the friction in MEMS devices. The reason for relatively elevated friction on $SiO_2$, as compared to a Ni surface (such as substrate 110) might be related to the surface roughness effect. The $SiO_2$ layer is grown using thermal CVD process and therefore has much higher roughness (20-20 nm) as compared to the few nm roughness of the e-beam evaporated Ni on the silicon surface.

Figure 8A:
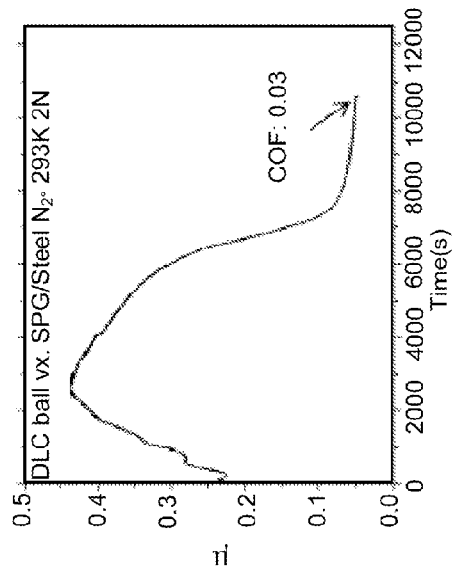
FIG. 8A shows a micrograph of minimal wear on a DLC coated ball.
Figure 8C:
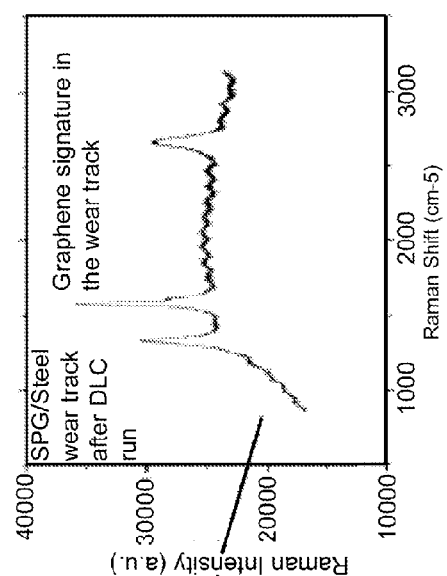
FIG. 8C shows coefficient of friction versus time for the DLC ball on SPG coated stainless steel and FIG. 8D shows a Raman spectrum for the system of FIGS. 8A and 8B.
Figure 8B:
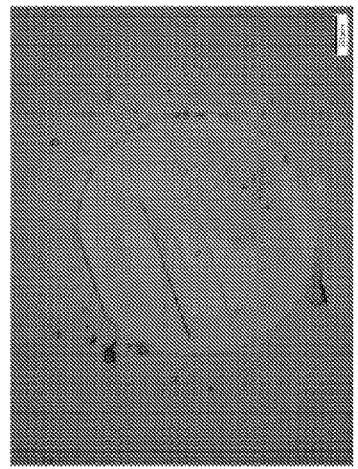
FIG. 8B shows wear on a stainless steel surface coated with SPG in sliding contact with the DLC ball of FIG. 8A.
Figure 8D:
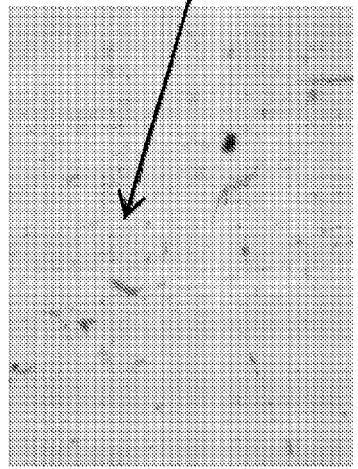

FIGS. 8A-8D show friction results obtained on a conventional stainless steel surface coated with SPG 170 rubbing against the DLC ball 130 in a dry nitrogen environment. As shown in FIG. 8C, the friction coefficient dropped to 0.03, after the SS surface 165 is spread with graphene flakes. The wear observed on the DLC ball 130 after the friction test was minimal, and no measurable wear was observed on the SS surface 165. The Raman characterization of FIG. 8D show results for the wear track produced on the SS surface 165 and shows a clear signature of the multilayer SPG type of graphene 170, confirming presence of multilayer graphene in the wear track. The atomically thin graphene SPG layers 170 on the SS surface 165 are acting as a wear protection layer reducing friction and eliminating wear. Similar friction behavior was observed on $SiO_2$ and Cu surfaces after sprinkling with the SPG graphene layers 170. The low friction behavior of the SPG graphene 170 appears to be universal and does not strongly depend on the substrate which can thus be a wide range of supporting materials important in commerce.

Graphene Oxide

In yet another embodiment graphene oxide was deposited on selected substrates and tribological tests determined that highly advantageous articles of manufacture can be produced. Commercially available graphene oxide was obtained from Graphene Supermarket, as HC-Graphene Oxide dispersed in an acqueous solution. Details are available at https://grapheen-supermarket.com-highly-concentrated-graphene-oxide-175-ml.html. The macroscale tribological behavior of solution processed graphene oxide (SPGO) layers were tested in dry $N_2$ and in humid environments and demonstrated performance quite similar to that of graphene layers, although providing a little higher coefficient friction and wear, as seen with tribological properties of oxidized graphene at the nanoscale.

XPS and Raman characterization are shown in FIGS. 11A-11D which demonstrate similarities and differences between these 2-dimensional carbon based SPG materials. Oxidized graphene shows much larger percentage of $sp^3$ bonds in comparison with $sp^2$ bonds, which dominate for graphene layers.

SPGO can advantageously be used in water solution environments and thus offers more flexibility and ease in application of SPGO with similar benefits including reducing friction and wear in steel against steel contacts (and also for other commercially useful materials).

Graphene oxide sheets which were highly concentrated and dispersed in water solution (5 g/L) (obtained from Graphene Supermarket) were deposited on a conventional steel surface. For the dry nitrogen environment tests the water was evaporated to leave graphene oxide flakes dispersed on the steel surface. In the case of tests performed in a "humid" environment, the sliding tests were performed in a liquid water solution to ensure sufficient supply of graphene oxide along the test surface for the whole duration of the test (see Table I for details).

TABLE I

| Tribo pair | Test conditions | Calculated Wear Volume | Wear rate (Wear/(load · distance)) | Coefficient of Friction |
|---|---|---|---|---|
| Steel/Steel | Air | $6.8 \times 10^{-3}$ mm$^3$ | $1.80 \times 10^{-5}$ mm$^3$/N · m | 1 |
| | Nitrogen | $4.9 \times 10^{-4}$ mm$^3$ | $1.31 \times 10^{-6}$ mm$^3$/N · m | 0.9 |
| With SPG | Adding drops/Air | $11.4 \times 10^{-7}$ mm$^3$ | $3.01 \times 10^{-9}$ mm$^3$/N · m | 0.15 |
| | Nitrogen | $9.6 \times 10^{-7}$ mm$^3$ | $2.54 \times 10^{-9}$ mm$^3$/N · m | 0.15 |
| With SPGO | Water/air | $2.5 \times 10^{-5}$ mm$^3$ | $6.51 \times 10^{-8}$ mm$^3$/N · m | 0.17 |
| | Nitrogen | $7.8 \times 10^{-5}$ mm$^3$ | $2.08 \times 10^{-7}$ mm$^3$/N · m | 0.16 |

As shown in FIG. 13, tribological studies under different loads of 1N, 2N, 3N and 5N show dependence of the graphene oxide protection lifetime on the applied load. This behavior is similar to graphene. Even though the wear of graphene oxide is little higher than the wear of graphene, the ability to use graphene oxide coated surfaces in water solutions opens highly advantageous possibilities for using it in many tribological applications.

In an additional embodiment the hereinafter described graphene and graphene oxide can be deposited on a substrate using an electro-deposition method, thereby co-depositing the graphene or graphene oxide along with a metal on the surface of the substrate. Such electrodeposited layers can be deposited in accordance with well-known electrodeposition methods on any suitable substrate to thereby passivate against corrosion and/or wear.

The following non-limiting examples illustrate various aspects of the invention.

EXAMPLE I

In order to further investigate observed superlubricity in other environmental conditions, a series of tests was done by varying gas environments such as in inert Argon, hydrogen and in vacuum as well as by changing the tribo-pairs. Superlow friction was observed with DLC rubbing against graphene in dry nitrogen or inert argon environment.

Tribological measurements have been performed in different ambient environments, including air, dry nitrogen, inert argon, hydrogen, and in high vacuum. As shown in FIGS. 4A-4E, the tribo-pair was changed from a DLC coated ball against graphene coated flat to a graphene coated ball against DLC coated flat. Instead of dry nitrogen, inert Argon gas was used to see whether just a dry environment was adequate to show superlubric behavior. Superlubric behavior was observed in an inert Argon environment demonstrating superlubricity in graphene vs. DLC tribo-pair in dry environment. The coefficient of friction stays around 0.2-0.4 in air for graphene/DLC tribo pair potentially due to the presence of water causing friction due to the capillary adhesion. In a dry nitrogen environment, the coefficient of friction drops below 0.01 indicating superlubric behavior in dry conditions. The presence of water in the ambient environment can play a crucial role in the tribological behavior of graphene. In case of hydrogen atmosphere, the coefficient of friction is around 0.05; and in vacuum, the coefficient of friction varies with a vacuum level and reaches as low as 0.06 for graphene/DLC interfaces at high vacuum conditions.

EXAMPLE II

FIGS. 5A and 5B show a pin-on-disc friction coefficient test carried out on graphene coated ball against DLC flat in high vacuum environment showing COF of 0.06 with no measurable wear. None of the any existing solid lubricant materials demonstrated such lowest friction coefficient in vacuum. Graphene/DLC tribo-pair can be useful for tribological contacts in outer space applications and in vacuum conditions.

EXAMPLE III

Different characterization techniques such as Raman spectroscopy, XPS, and ToF-SIMS, have been used to characterize chemical state of graphene and DLC contacts at the tribological interface between graphene and DLC before and after tribological tests. FIGS. 6A-6F describes results of Raman characterization of the wear track obtained from the DLC coated ball and from the wear track produced on the graphene coated Ni surface. These results were obtained from the DLC vs Graphene/Ni tribo-pair running in dry $N_2$ atmosphere during initial 0.6 meters of sliding distance.

Figures 6A, 6B, 6C, 6D, 6E, 6F:
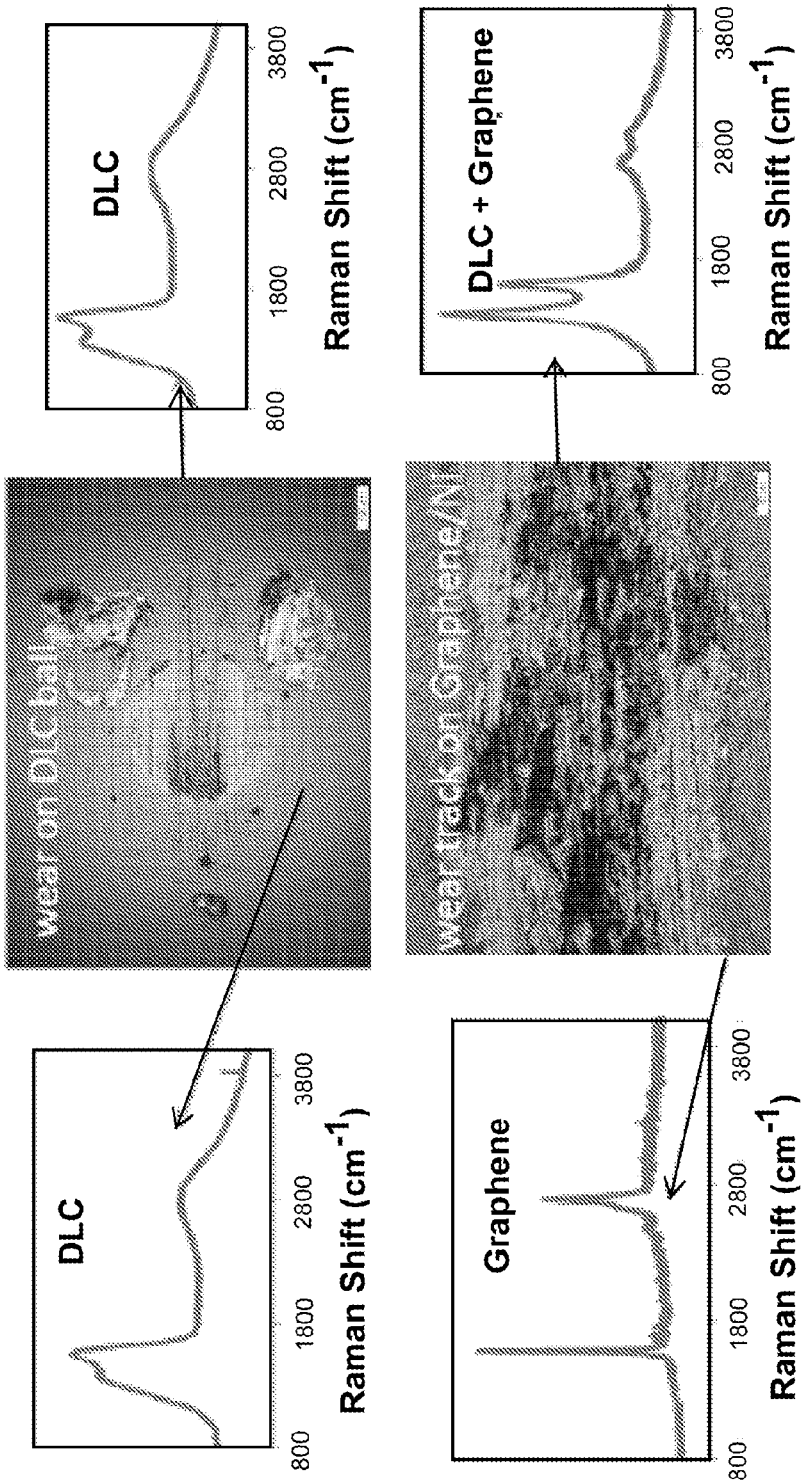
FIG. 6A shows a micrograph of wear on a DLC ball with FIG. 6B the Raman shift measured outside the wear track and FIG. 6C the Ramen shift inside the wear track.
FIG. 6D shows a micrograph of wear on a graphene on Ni surface with FIG. 6E for the Raman shift measured outside the wear track and FIG. 6F for the Raman shift measured inside the wear track.

As shown in FIG. 6A in the optical image of the DLC ball, the wear is minimal; and there is no significant change in the DLC Raman signature obtained from inside and outside of the wear track (see FIGS. 6B and 6C). In the case of a wear track produced on the graphene coated Ni surface (see FIG. 6D), it was noted that the Raman signature taken from the inside of the wear track (FIG. 6F) indicates that the well ordered signature of multilayer graphene (taken from outside of the wear track (FIG. 6E)) is modified considerably and a defect peak emerged at 1350 cm$^{-1}$ indicating a well ordered graphene layer is modified during the initial wear cycles. A closer look at the Raman spectrum also confirms transfer of DLC within the wear track possibly from the DLC ball.

EXAMPLE IV

Figure 9B:
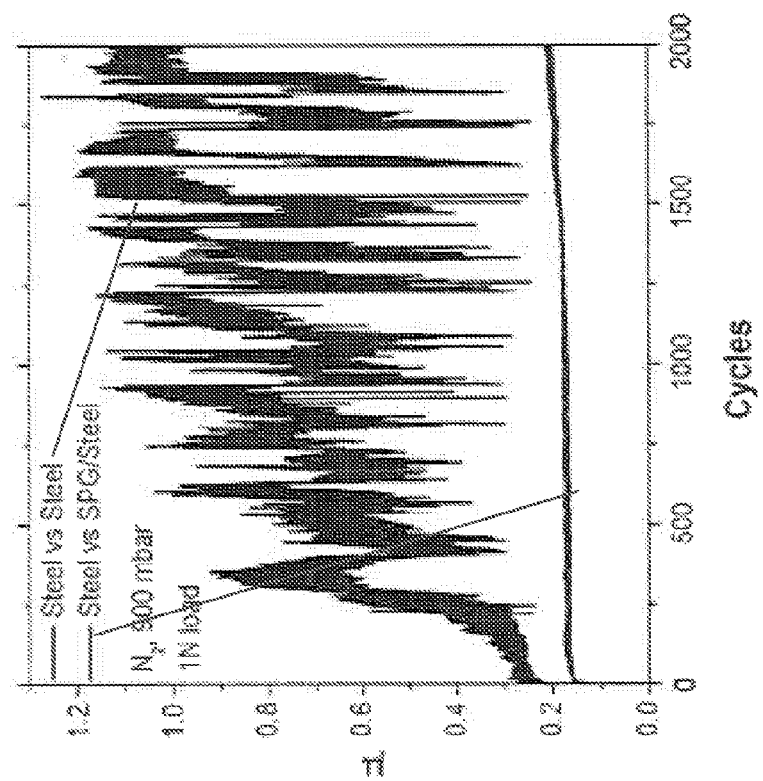
FIGS. 9A and 9B show variation of coefficients of friction for self-matted steel test pair with FIG. 9A showing results for humid air without SPG, with SPG in ethanol solution, and with intermittent supply of SPG.
Figure 9A:
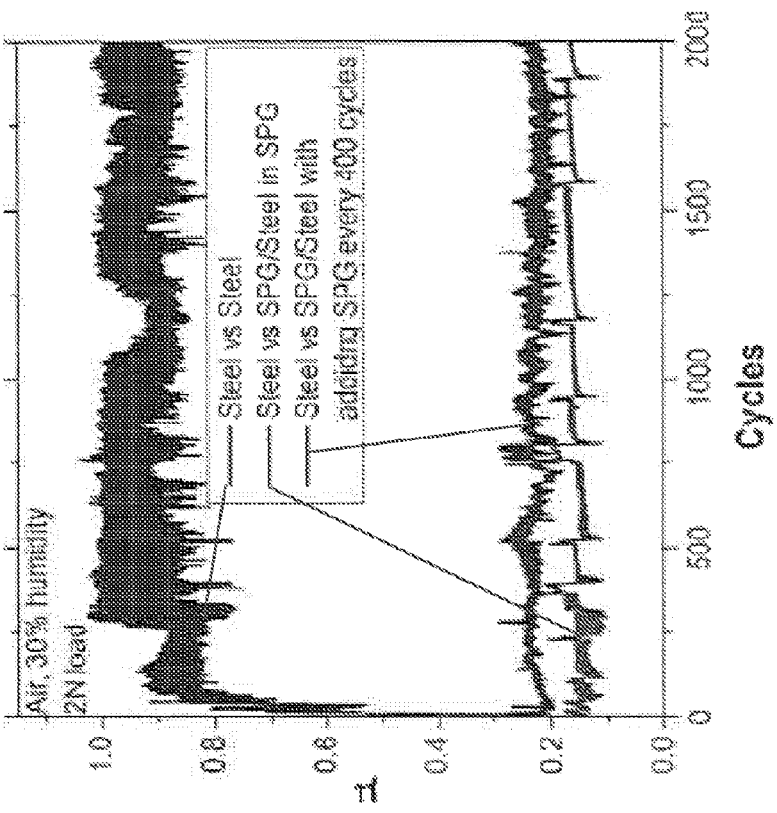
Figure 11A:
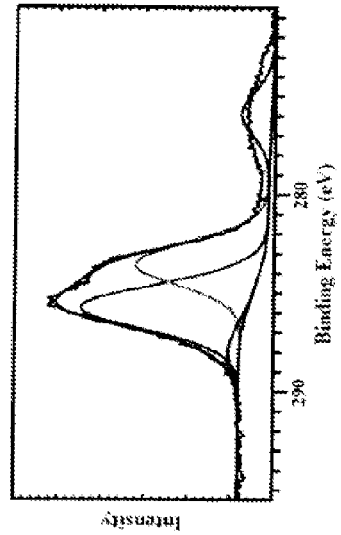
FIGS. 11A(1) AND 11A(2) are an XPS spectra for SPG and FIGS. 11B(1) and 11B(2) are comparisons with the XPS spectra for SPGO.
Figure 11B:
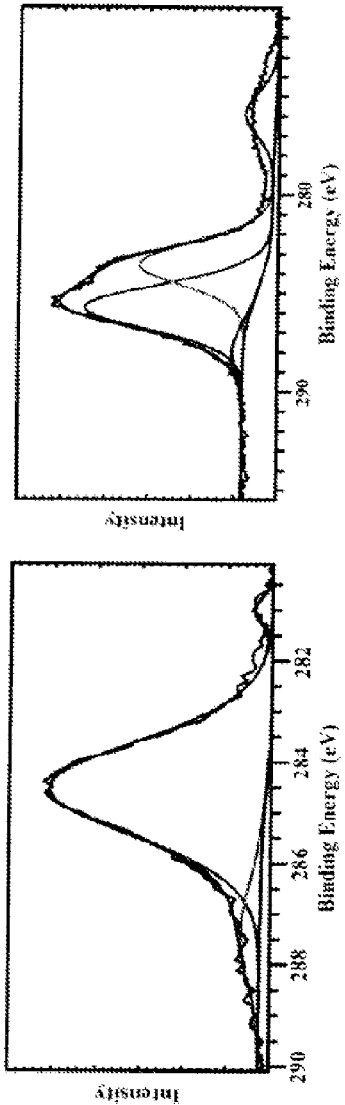
FIG. 11C is a Raman spectra for SPG and FIG. 11D is a comparison with the Raman spectra for SPGO.
Figure 11C:
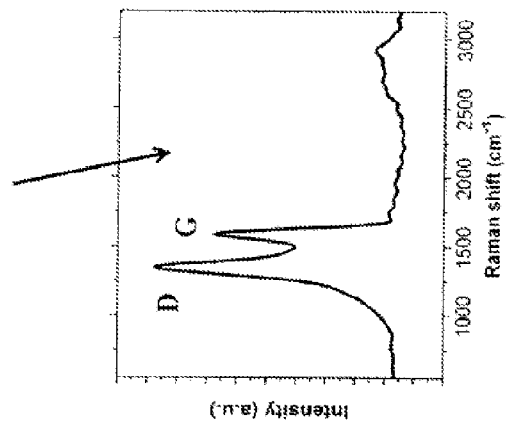
Figure 11D:
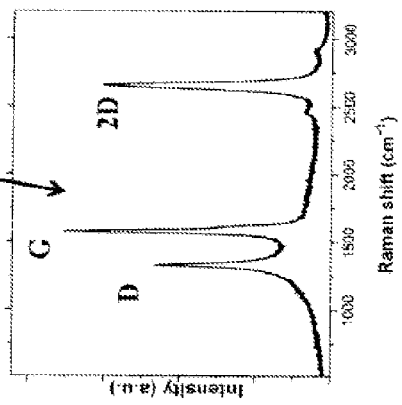
Figure 12B:
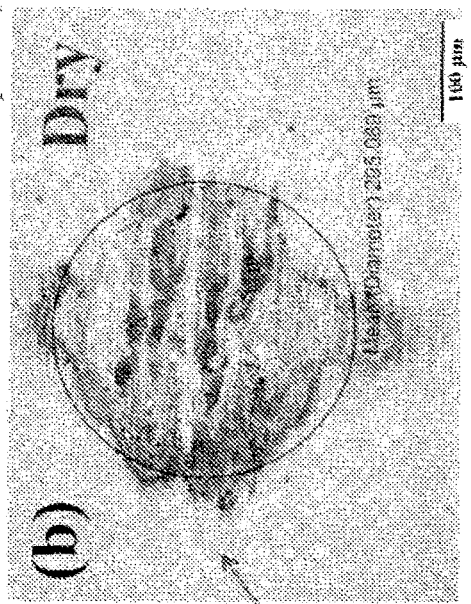
FIG. 12B shows a micrograph of the test surface in dry $N_2$ and FIG. 12C shows a micrograph of the test surface in a humid atmosphere.
Figure 12C:
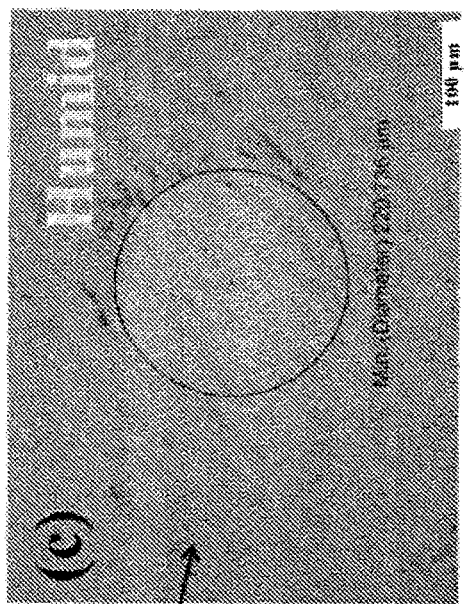
Figure 12A:
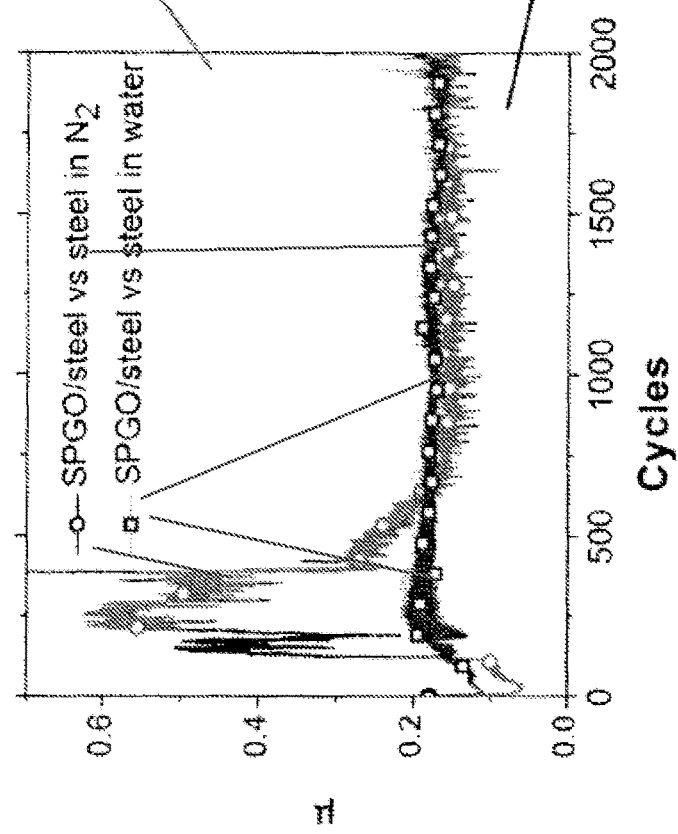
FIG. 12A shows coefficient of friction versus test cycles for a comparison between SPGO/steel versus steel in dry $N_2$.

In this example self-mated steel tribo-pair is used, which is one of the most used tribo-pair in the automotive industry. Tribological studies were performed in air (30% relative humidity) and in dry $N_2$ at room temperature using a CSM tribometer with a ball-on-disk contact geometry. The stainless steel flat samples (440C grade) were initially cleaned by sonication in acetone and then in isopropanol alcohol to remove any organic contaminants that may have left from the machining and polishing operations. As the counterpart, the stainless steel ball (440C grade) of 9.5 mm diameter was used. The normal load during the tribotests was 2 N at the speed of 60 rpm (or 9 cm/s) and the radius of the wear track was 15 mm. Solution processed graphene (SPG) prepared by chemical exfoliation of the highly oriented pyrolytic graphite (HOPG) and suspended in ethanol was used. The weight concentration of graphene was 1 mg/L. Before the tribological tests, graphene-containing ethanol solution was applied on the highly polished surfaces of stainless steel plates and evaporated in dry nitrogen environment to prevent graphene oxidation. Formation of a single or several layers of graphene on steel surface has been confirmed by an Invia Confocal Raman Microscope using red laser light ($\lambda$=633 nm). To study the effect of graphene on friction and wear of sliding steel test pairs in humid air environment, we performed four model experiments: 1) Steel against steel, 2) steel against SPG on steel submerged in liquid SPG, and 3) steel against SPG on steel with constant supply of SPG drops from solution every 400 cycles and 4) steel against steel in dry $N_2$ with 1 N load. The constant supply of SPG was necessary to ensure graphene presence in the wear track all the time. FIGS. 9A and 9B illustrate the coefficients of friction for all four cases. The coefficient of friction for bare steel interfaces is initially low but increases rapidly with the removal of the surface contaminants and/or a natural oxide layer from the surface and reaches a value of about 0.9 and stays at this level for the reminder of the test. The test performed in liquid SPG solution showed that ethanol with SPG reduces COF down to 0.2. Here, the COF reduction is thought to be due to the combined lubrication effect of both ethanol and graphene flakes. However, tests performed with adding pure ethanol (not shown here) showed a high COF (i.e., 0.4-0.5) and caused high wear, thus suggesting that graphene is most likely the reason for reduction in friction. The last data set when SPG was supplied to the wear track periodically in drops every 400 cycles. As shown in FIG. 9(A), such a practice reduces COF down to around 0.15; and such a reduction in friction can be attributed to the continuous supply of graphene layers into sliding contact interface. The periodicity of 400 cycles (or every 6-7 minutes) is long enough to evaporate the ethanol from the steel surface, thus eliminating the alcohol's contribution or effect, but leaving behind the graphitic layer within the wear track. Moreover, the fairly stable frictional behavior attained by adding drops of SPG into the sliding interface indicates that the low friction behavior can be preserved for quite a long time. In the second case (FIG. 9(B)), we run the test at little lower load but in dry N2 environment and in that case also we observe the same trend of low friction and wear. The results clearly confirm friction reducing effect of SPG. In the following, impact on wear is described. In this case, specifically, wear rates on the ball and flat sides with and without SPG on sliding surfaces are investigated. FIG. 10A-10C show 3D profilometer images and associated height profiles of the same wear tracks corresponding to each friction test shown in FIG. 9A and 9B. The high wear occurs mostly for the bare steel interfaces when no protective layer exists. For the liquid SPG solution run (see FIG. 10B), the wear scar width is 3 times smaller than that of the bare steel run(see FIG. 10A) and line profile measurements indicate formation of graphene protection layer (as confirmed by Raman spectroscopy not shown here). However, due to the presence of liquid in the wear track, the capillary forces at the interface does not allow formation of uniform protection layer and the graphene flakes continuously gets pushed away on the side of the wear track during each wear cycle, therefore the density of graphene is too low to form uniform protection layer within the wear track. For the case of graphene supply in solution drops, the wear track width is 10 times smaller than that of bare steel. This fact indicates that graphene, forms a uniform protection layer and thus plays a major role in reducing wear and friction at the tribological interface. The corresponding line profile of the wear track in this case (see FIG. 10C) indicates formation of protective layer on the steel. 3D profilometer imaging of the ball wear for this test indicated that the wear occurs at the initial stage with a following formation of the protective layer.

The COF measurements and the wear calculation results for the ball sides are summarized in Table II given below. The ball wear diameters are measured with Olympus UC30 Optical Microscope.

TABLE II

Ball wear calculation and COF measurements for the tests in air and in dry N2.

| Steel wear | Wear (2000 cycles) | COF |
|---|---|---|
| Without SPG | $6.8 \times 10^{-6}$ cm$^3$ | 0.9 |
| In liquid SPG | $5.0 \times 10^{-8}$ cm$^3$ | 0.2 |
| Adding drops of SPG every 400 cycles | $1.1 \times 10^{-9}$ cm$^3$ | 0.15 |
| In dry N$_2$ | $5.0 \times 10^{-10}$ cm$^3$ | 0.15 |

The ball wear results presented in the Table II show that wear reduces by 2-3 orders magnitude due to the considerable slowing of tribo-corrosion process that generally occurs on steel surfaces during sliding action, which ultimately results in high amount of wear and high friction. The Raman studies carried out in the wear track (not shown here) with solution processed graphene showed no sign of corrosion but presence of graphene in the wear track indicating formation of corrosion protection layer by the graphene. The graphene layer formed in the wear track not only retards the tribo-corrosion process but also allows easy shearing, which helps in reducing friction. The wear on the flat side in case of SPG coated steel is almost impossible to measure indicating seminal and substantial contribution of graphene in reducing wear and friction.

The foregoing description of embodiments of the present invention have been presented for purposes of illustration and description. It is not intended to be exhaustive or to limit the present invention to the precise form disclosed, and modifications and variations are possible in light of the above teachings or may be acquired from practice of the present invention. The embodiments were chosen and described in order to explain the principles of the present invention and its practical application to enable one skilled in the art to utilize the present invention in various embodiments, and with various modifications, as are suited to the particular use contemplated.

The invention claimed is:

1. A solution processed wear member article of manufacture, comprising:
    a first substrate;
    oil free solution processed graphene oxide flakes deposited on the first substrate; and
    a second substrate forming an opposing wear member of the solution processed material disposed on the first substrate, the second substrate comprising a diamond-like coating (DLC);
    wherein the first substrate and the second substrate interact oil free.

2. The solution processed wear member as defined in claim 1 wherein the first substrate is selected from the group of a steel and a transition metal.

3. The solution processed wear member as defined in claim 2 wherein the transition metal is selected from the group of Cu and Ni.

4. The solution processed wear member as defined in claim 1 wherein the second substrate comprises a metal.

5. The solution processed wear member as defined in claim 1 further including an inert environment surrounding the first substrate and the second substrate consisting of at least one of, $N_2$, Ar and a high vacuum.

6. The solution processed wear member as defined in claim 1 wherein the graphene form of the wear member has a coefficient of friction of about 0.003-0.005 in selected atmospheres and the graphene oxide has a coefficient of friction of about 0.15-1.0 in selected atmospheres.

7. A graphene wear member article of manufacture, comprising:
    a housing having deposited therein:
        a first substrate;
        a dry, oil free layer of solution processed graphene oxide flakes disposed on the first substrate;
        a second substrate forming an opposing wear member of the layer of solution processed graphene oxide on the first substrate; and
        the first substrate and second substrate housed in a dry, inert environment within the housing.

8. The graphene wear member article of manufacture of claim 7 wherein the dry, inert environment is selected from the group consisting of $N_2$, Ar and a high vacuum.

* * * * *